United States Patent
Geges et al.

(10) Patent No.: US 10,392,832 B2
(45) Date of Patent: Aug. 27, 2019

(54) DEVICE WITH A SENSOR AND AN ACTUATOR AND METHOD FOR TESTING THE DEVICE

(71) Applicant: ELESTA GmbH, Ostfildern (DE), Zweigniederlassung Bad Ragaz, Bad Ragaz (CH)

(72) Inventors: Norbert Geges, Vilters (CH); Andreas Guntli, Walenstadt (CH); Raphael Möhr, Maienfeld (CH); Verena Lukas, Zizers (CH); Roman Steiner, Ernetschwil (CH); Dietmar R. Zöschg, Schönenberg (CH)

(73) Assignee: ELESTA GMBH, OSTFILDERN (DE) ZWEIGNIEDERLASSUNG BAD RAGAZ (CH)

( * ) Notice: Subject to any disclaimer, the term of this patent is extended or adjusted under 35 U.S.C. 154(b) by 0 days.

(21) Appl. No.: 16/185,442

(22) Filed: Nov. 9, 2018

(65) Prior Publication Data

US 2019/0136576 A1    May 9, 2019

(30) Foreign Application Priority Data

Nov. 9, 2017 (CH) ...................................... 1353/17

(51) Int. Cl.
  *G08B 21/00* (2006.01)
  *E05B 17/22* (2006.01)
  (Continued)

(52) U.S. Cl.
  CPC .......... *E05B 17/22* (2013.01); *E05B 47/0001* (2013.01); *G08B 21/18* (2013.01); *E05B 2047/0067* (2013.01); *E05Y 2900/608* (2013.01)

(58) Field of Classification Search
  CPC ................. E05B 17/22; E05B 47/0001; E05B 2047/0067; G08B 21/18; E05Y 2900/608;
  (Continued)

(56) References Cited

U.S. PATENT DOCUMENTS 6,409,083 B1 * 6/2002 Link ................... H03K 17/945
                                                        235/449
7,548,159 B2 * 6/2009 Pullmann ........... H03K 17/9502
                                                        340/545.1

(Continued)

*Primary Examiner* — Anh V La
(74) *Attorney, Agent, or Firm* — Morriss O'Bryant Compagni Cannon, PLLC

(57) ABSTRACT

A device includes a sensor and an actuator. The sensor has a receiving circuit with a sensor and a detector, as well as a computer connected to the detector. The sensor cooperates with the actuator to generate a first receiving circuit signal during a normal operation when a switching distance between the sensor and the actuator is undershot. The detector generates a first output signal as a function of the first receiving circuit signal, and to transmit transmits the first output signal to the computer. The receiving circuit includes a signal emulator and a switch-over element. The signal emulator generates a second receiving circuit signal during a test operation. The detector generates a second output signal as a function of the second receiving circuit signal and transmits the second output signal to the computer. The device can repeatedly switch between normal operation and test operation.

15 Claims, 3 Drawing Sheets

(51) Int. Cl.
*G08B 21/18* (2006.01)
*E05B 47/00* (2006.01)

(58) Field of Classification Search
CPC ............... H03K 17/97; H03K 17/9502; H03K 2217/958; H03K 2017/9706; G05B 19/048; G05B 19/0423; G05B 19/0428; G05B 9/03; G05B 2219/24189; G05B 2219/21144; G05B 2219/24008; G01N 35/00584; H01H 47/005; H01H 2300/054; H02K 3/50
USPC ......... 340/545.1, 540, 686.6, 686.1; 235/449
See application file for complete search history.

(56) References Cited

U.S. PATENT DOCUMENTS 7,898,118 B2 * 3/2011 Nitsche ................ H01H 47/005
  307/326
9,423,784 B2 * 8/2016 Arth ......................... G05B 9/03

* cited by examiner

DEVICE WITH A SENSOR AND AN ACTUATOR AND METHOD FOR TESTING THE DEVICE

CROSS-REFERENCE TO RELATED APPLICATION

This application claims priority to Swiss Patent Application No. 01353/17 filed Nov. 9, 2017, the entirety of which is incorporated by this reference.

TECHNICAL FIELD

The invention relates to a device that is suitable for monitoring a closing position of two parts that are movable relative to one another, in particular for use as a door contact switch, for example, in a safety door for securing an automatically operating technical installation.

The device contains an actuator and a sensor, as well as components for testing the device.

The invention also relates to a method for testing the device.

PRIOR ART

In the event of automatically operating technical installations that constitute a risk to human health, it must be ensured that in the event of a change in the position of a protective arrangement monitoring the access to the installation measures for reducing risk are initiated, that is to say for example an alarm is triggered and/or the installation is switched off.

It is known to use safety switches for monitoring the position of a protective arrangement, such as for example a protective door or a machine cladding. Such safety switches usually have a sensor and an actuator, the switching state of the safety switch being dependent upon the spacing of the actuator from the sensor. Due to the fastening of the sensor to one of two parts movable relative to one another and the fastening of the actuator to the other one of such parts, such as for example a door frame and a door leaf of a protective door, the closing position of the protective arrangement can be monitored.

In order to be able to ensure the functional capability of such a safety switch during its entire operating period, a functional test is necessary that in the present case takes the form of a self-diagnosis. By such a self-diagnosis it is possible to discover faults during the operating period in the safety switch.

A non-secure proximity switch comprising a sensor, a further processing unit and a microprocessor is known from EP0969600A1 A. The further processing unit (receiving circuit) serves for processing of an analog signal received from the sensor in normal operation and for subsequent forwarding to the microprocessor for evaluation there. Moreover, the microprocessor is connected by means of a network to the input of the further processing unit and thus can supply a test signal for functional testing of the further processing unit. The disadvantage of this device is that the further processing unit cannot be checked to a sufficient extent for safety-relevant applications. Only the sensitivity of the amplifier and the amplification can be checked. This method is not suitable for a complex examination of the further processing unit, because further components necessary for safety-relevant applications such as transceiver and storage unit of the transceiver cannot be tested therewith.

Advantages of the Invention

The present invention provides an alternative device that is suitable for monitoring a closing position of two parts that are movable relative to one another, and in particular for use as a door contact switch.

The device is advantageously be capable of carrying out a functional testing of components of the receiving circuit, and a method is proposed for this purpose.

Further advantages of the present invention are apparent from the following description.

SUMMARY OF THE INVENTION

The above-mentioned advantages are achieved by a device according to the present invention.

The invention relates inter alia to a device, in particular a door contact switch, containing a sensor and an actuator. The device has two operating states: A normal operating state (abbreviated to "normal operation") and a test operating state (abbreviated to "test operation"). The sensor has a receiving circuit that contains a sensor element and a detector element. Furthermore, the sensor has a computer unit connected to the detector element. The sensor element is configured to co-operate with the actuator in normal operation in order to generate a first receiving circuit signal if a switching distance between the sensor element and the actuator is undershot. The detector element is configured to generate a first output signal as a function of, and in particular from the first receiving circuit signal, and to transmit this first output signal to the computer unit. In addition, the receiving circuit has a signal emulator and a switch-over element, the device being switchable between normal operation and test operation by means of the switch-over element. The signal emulator is configured to generate a second receiving circuit signal in test operation, the detector element being configured to generate a second output signal as a function of, and in particular from the second receiving circuit signal and to transmit this second output signal to the computer unit.

As a function of one or more of the received output signals, the computer unit can then optionally initiate measures, in particular, to generate a signal (for example a release signal or an error signal) and/or to change a switching state or the operating state of the device (for example, to switch off the device or to set it to the state which prevails if in the normal state a switching distance between sensor and actuator is not undershot).

Moreover, a method for testing a device, such as is described in this document, is disclosed. In the method the device is switched by means of the switch-over element from normal operation to test operation, the signal emulator generates a second receiving circuit signal and the detector element generates a second output signal from the second receiving circuit signal and/or as a function thereof, the second output signal is transmitted to the computer unit. In particular, the signal emulator can emulate the sensor element in this way.

Features are described below which should be considered (individually) as desired features, even if they are not explicitly designated as such. The features may be disclosed separately (as part of any device or of any method) and—if they are not precluded—in any combination. This includes the possibility of simultaneously implementing all the described features.

The device is advantageously a device for monitoring a spacing and/or a relative position (in particular a closing position) of two parts that are movable relative to one another. In this case the actuator is configured for fastening to one part (for example a door leaf) and the sensor is configured for fastening to the other part (for example a door frame).

The device is suitable, among other things, for monitoring the position of a protective arrangement (for example, a protective door or a machine cladding). Such a protective arrangement can monitor the access to a danger zone (for example, a space having a dangerous machine part). In particular, the device can be a door contact switch for a protective door for securing an automatically operating apparatus.

The device is advantageously a switch, in particular a safety switch and/or a door contact switch and/or a proximity switch. A change in the switching state of said switch can be brought about by a change in the position of said protective arrangement and/or of the spacing between said parts that are movable relative to one another. Further measures can be implemented as a function of the switching state of the switch. In particular, as one such measure a second device such as, for example, an alarm system, a closing mechanism, the power supply to a machine, etc., can be actuated (in particular activated or deactivated).

The device, in particular for use as a door contact switch, contains a sensor and an actuator.

The sensor can be, for example, an optical sensor, an electric (in particular capacitive or inductive) sensor or a mechanical sensor or an ultrasound sensor.

The sensor has a sensor element, a detector element, a signal emulator and a switch-over element, these components form a receiving circuit and/or being part of a receiving circuit. Furthermore, the sensor contains a computer unit.

The sensor element can be, for example, a receiver coil, a photodiode or a phototransistor.

The sensor element is connected or can be connected (in particular physically and/or electrically) to the detector element and/or is coupled or can be coupled thereto (in particular by the switch-over element).

Expediently, in normal operation the sensor element is connected or can be connected (in particular physically and/or electrically) to the detector element and/or is coupled or can be coupled thereto (in particular by the switch-over element). Alternatively or in addition, in normal operation a signal transmission (in particular of the first receiving circuit signal) from the sensor element to the detector element is provided and/or is possible.

In test operation of the device the sensor element can be connected and/or coupled to the detector element (in particular physically and/or electrically) or the sensor element can then be separated and/or decoupled therefrom (in particular physically and/or electrically). The latter is desireable, because then the normal operation and the test operation are independent of one another. Alternatively or in addition, in the test operation a signal transmission (in particular of the first receiving circuit signal) from the sensor element to the detector element is not possible.

The sensor and/or the sensor element are configured to interact with the actuator (in particular in normal operation of the device) if a defined switching distance between the sensor element and the actuator is undershot. The switching distance can be, for example, less than 500, 50, 10 or 5 millimeters. Due to the interaction a first receiving circuit signal is generated by the sensor element and/or in the receiving circuit. If the device is a switch, alternatively or additionally the switching state of the device can be changed by the interaction.

Advantageously the first receiving circuit signal is a defined receiving circuit signal.

According to a variant the first receiving circuit signal can be generated by the sensor as a function of the actuator. Thus, if the actuator is a RFID actuator, the first receiving circuit signal can, for example, be configured specifically for the RFID actuator.

The sensor has a signal emulator. The signal emulator is connected or can be connected (in particular physically and/or electrically) to the detector element and/or is coupled or can be coupled thereto (in particular by the switch-over element).

Expediently, in the test operation of the device the signal emulator is connected (in particular physically and/or electrically) to the detector element and/or is coupled thereto). Alternatively or in addition, in the test operation a signal transmission (in particular of the emulated receiving circuit signal) from the signal emulator to the detector element is possible.

In the normal operation of the device the signal emulator can be connected and/or coupled to the detector element (in particular physically and/or electrically) or the signal emulator can then be separated and/or decoupled therefrom (in particular physically and/or electrically). The latter is desireable, because then the normal operation and the test operation are independent of one another. Alternatively or in addition, in normal operation a signal transmission (in particular of the emulated receiving circuit signal) from the signal emulator to the detector element is not possible and/or is not provided.

Advantageously, the signal emulator is connected and/or coupled (in particular physically and/or electrically) to the computer unit.

In the test operation an emulated receiving circuit signal, in particular the second receiving circuit signal, is generated by the signal emulator and/or in the receiving circuit.

In particular, the signal emulator can be configured in order, during the same test operation or during other test operations (i.e. those test operations which are separated therefrom and/or from one another by at least one change in the normal operation), to generate one or more (for example at least 5, 10 or 50 and/or at most 500 or 100) further emulated receiving circuit signals which differ from the second receiving circuit signal and/or from one another. The detector element can then be configured in order to generate an emulated output signal in each case from one or more further emulated receiving circuit signals and/or as a function thereof and to transmit the signal to the computer.

The emulated receiving circuit signal can be configured to be constant or alternating (in particular in relation to the signal strength, frequency and/or the succession of data packets described further below).

It may be advantageous if the emulated receiving circuit signal, in particular the second receiving circuit signal, and/or the further emulated receiving circuit signals, are stronger than the first receiving circuit signal, for example at least 2, 5 or 10 times as strong.

The signal emulator may be configured in order to generate the second receiving circuit signal from the second control signal and/or as a function thereof. The second control signal is transmitted to the signal emulator, the second control signal may be generated by the computer unit and/or transmitted by the computer unit to the signal emulator.

For example, the signal emulator can be configured in order to generate the second receiving circuit signal by modulating the second control signal onto a carrier wave. The carrier wave can, for example, be generated by the detector element and/or the detector element can generate the second output signal by demodulation of the second receiving circuit signal. Alternatively or additionally the signal emulator can be controlled by the computer unit.

The first receiving circuit signal and/or the emulated receiving circuit is advantageously a modulated (in particular digitally modulated) analog signal.

The signal emulator and the computer unit together may determine the signal shape of the second receiving circuit signal. Thus, via the signal emulator the computer unit can define a signal shape known to this emulator. By means of the output signal then received, the computer unit can ascertain whether or not the detector element is functioning correctly.

The detector element can be, for example, a transceiver, an amplifier, a receiver, a demodulator and/or a converter. The detector element is connected to the computer unit.

The detector element is configured to generate a first and/or an emulated output signal and to transmit it to the computer unit upon reception of the first and/or an emulated receiving circuit signal and/or as a function of the first and/or an emulated receiving circuit signal.

The detector element can generate said output signal, for example, by processing said receiving circuit signal, in particular converting it (for example decoding and/or demodulating it). Alternatively or in addition, the output signals can be decoded information signals which have been generated by decoding of the receiving circuit signals by means of the detector element.

It is advantageous if the detector element is configured in order to process all receiving circuit signals by the same method and/or in the same way.

In one embodiment, the detector element cannot distinguish between different receiving circuit signals. Such a detector element can be tested simply.

In particular, the detector element may be configured to generate a first output signal and to transmit it to the computer unit upon reception of the first receiving circuit signal and/or as a function of the first receiving circuit signal, the first receiving circuit signal being decoded for generating the first output signal. The detector element is advantageously configured to generate an emulated output signal and to transmit it to the computer unit upon reception of the emulated receiving circuit signal and/or as a function of the emulated receiving circuit signal, the emulated receiving circuit signal being decoded for generating the emulated output signal.

According to a variant the detector element is configured in order to generate a carrier wave. In this case the sensor element can be configured to modulate a signal onto the carrier wave, so that the first receiving circuit signal is formed and/or the signal emulator can be configured to modulate a signal (in particular the second control signal) onto the carrier wave, so that the emulated receiving circuit signal is formed. The generation of the first and/or the emulated output signal can then take place, as described above, by demodulation.

The detector element can be configured to amplify the first and/or the emulated receiving circuit signal.

Furthermore, the detector element can be configured to convert the first and/or the emulated receiving circuit signal from an analog signal into a digital signal.

It may be advantageous if the detector element stores the first and/or the emulated receiving circuit signal and has a memory for this purpose (cf. also below).

Furthermore, the sensor has a switch-over element, the switch-over element being configured for switching the device from normal operation to test operation and from test operation to normal operation.

In particular for this purpose the sensor element and/or the signal emulator can be connected and/or coupled to the detector element by means of the switch-over element and also disconnected and/or decoupled (in particular physically and/or electrically and/or by interruption of a line) from the detector element. A complete and/or physical separation and/or decoupling is desireable.

Furthermore, the switch-over element can be connected and/or coupled (in particular physically and/or electrically) to the computer unit.

According to a variant, the switch-over element is configured to perform one or more of the above-mentioned actions (in particular the switch-over between normal operation and test operation) as a function of a first control signal. The first control signal is transmitted to the signal emulator, the first control signal may be generated by the computer unit and/or transmitted by the computer unit to the switch-over element.

Alternatively or additionally the switch-over element can be controlled by the computer unit.

The device and/or the computer unit can be configured and/or programmed to switch over from normal operation into test operation and/or from test operation into normal operation by means of the switch-over element repeatedly, in particular periodically or aperiodically.

The period of the testing (time between the start of a test operation and the start of the next test operation) can advantageously be at least 5, 10 or 20 milliseconds and/or at most 80, 60 or 40 milliseconds.

The test duration (duration of a test operation) can advantageously be at least 2, 4 or 5 milliseconds and/or at most 20, 15 or 10 milliseconds.

The signal emulator and the switch-over element can be configured as separate elements or can form a common element.

The information transported by the first and/or the emulated receiving circuit signal can be structured in the form of a succession of data packets According to a variant the information can be a sequence of numbers. If the actuator is a RFID tag, said information can, for example, include the number associated with the RFID tag.

It is advantageous if the switchover of the device takes place by means of the switch-over element from normal operation to test operation and/or from test operation to normal operation as a function of the succession of data packets of the first and/or the emulated receiving circuit signal. In particular, said switchover can take place between two successive data packets of the first receiving circuit signal and/or the emulated receiving circuit signal.

According to a variant of an embodiment the succession of data packets of the first and/or the emulated receiving circuit signal contains in each case contains a plurality of (for example at least 2, 5 or 10 and/or at most 100, 50 or 20) different data packets.

Alternatively, the succession of data packets of the first and/or the emulated receiving circuit signal in each case can also contain only one repeating data packet.

The first receiving circuit signal and the second receiving circuit signal can be configured identically and/or can lead to the generation of identical output signals. In this way the sensor element can be emulated by the signal emulator.

The first receiving circuit signal can be configured differently to one, two, three, four or more of the further emulated receiving circuit signals and/or can be partially (in particular at least 20, 40, 60 or 80 and/or at most 99, 95 or 90 percent) identical thereto. The one, two, three, four or more of the further emulated receiving circuit signals can advantageously be configured differently from one another and/or partially (in particular at least 20, 40, 60 or 80 and/or at most 99, 95 or 90 percent) identical. According to a variant, the one, two, three, four or more of the further emulated receiving circuit signals differ from one another in relation to the same part or in relation to respective different parts of the first receiving circuit signal. This makes it possible to determine which part of the first receiving circuit signal is possibly generated incorrectly, transmitted or further processed. Every error does not necessarily have to be so serious that the device must be replaced.

The device, in particular the detector element, can have a memory, the memory (in particular different parts of the memory) being tested by the use of different emulated receiving circuit signals. For example, the memory can have a memory capacity of 'n' Bits and a plurality of (for example 'n') different receiving circuit signals can be generated which differ from one another in each case only in one Bit. Thus each Bit of the memory can be tested.

Finally, the sensor has a computer unit. The computer unit is advantageously configured for evaluation of the first and/or the emulated output signal and/or for control of the switch-over element and/or for control of the signal emulator.

The computer unit can comprise one or more logic units, microprocessors, ASICs ("application-specific integrated circuits"), CPLDs ("complex programmable logic devices") and/or FPGAs ("field-programmable gate arrays").

The computer unit can be connected to the switch-over element, the computer unit being configured to generate a first control signal for control of the switch-over element and to transmit this signal to the switch-over element. The switch-over between normal operation and test operation can then take place as a function of the first control signal.

Alternatively or in addition, the computer unit can be connected to the signal emulator. The computer unit can be configured to generate a second control signal for control of the signal emulator and to transmit it to the signal emulator. The emulated receiving circuit signal can then be generated by the signal emulator from the second control signal and/or as a function thereof.

The evaluation of the output signals is advantageously carried out by the computer unit. A release signal can be generated, for example, as a function of the first output signal, and/or an error signal can be generated as a function of the second output signal.

The computer unit then initiates measures as a function of one or more the received output signals, as has been described above. In particular, the computer unit can compare two or more output signals (for example, the first output signal with the second output signal), said measures being introduced as a function of the result of the comparison.

Alternatively or in addition, the computer unit can compare the second receiving circuit signal or the second control signal with the second output signal, said measures being introduced as a function of the result of the comparison.

The actuator can be, for example, a transponder (in particular based on a RFID sensor principle) or a metal (in particular based on an inductive sensor principle) or a magnetic or dielectric material (in particular based on a capacitive sensor principle).

The sensor element is configured to co-operate with the actuator during normal operation in order to generate the first receiving circuit signal if a switching distance between the sensor and the actuator is undershot, the first receiving circuit signal being transmitted to the detector element.

A method for testing a device, such as is described in this document, can be characterized by the following steps: switching the device from normal operation to test operation by means of the switch-over element; generating the emulated receiving circuit signal by den signal emulator and/or the computer unit and transmitting the emulated receiving circuit signal to the detector element; generating an emulated output signal from the emulated receiving circuit signal and/or as a function thereof (in particular by decoding of the emulated receiving circuit signal) by means of the detector element; and transmitting the emulated output signal to the computer unit.

During switching from normal operation to test operation by means of the switch-over element, the sensor element is advantageously completely separated from the detector element.

During the test operation one or more different emulated receiving circuit signals can be generated by the computer unit with the aid of the signal emulator, and these signals are then transmitted to the detector element.

A plurality of different emulated receiving circuit signals may be generated during this test operation or during successive test operations. Different emulated output signals are then generated by the detector element as a function of the emulated receiving circuit signals and are transmitted to the computer unit.

It can be provided that the behavior of the sensor element is simulated by the signal emulator. In particular for this purpose the second receiving circuit signal generated by the signal emulator is configured substantially like the first receiving circuit signal generated by the sensor element.

Test operation and normal operation can alternate with one another multiple times (in particular periodically or aperiodically and/or at least 2, 5, 10 or 100 times). According to a variant, the time interval between two successive test operating states and/or two successive normal operating states is constant. The test operation can be (but does not have to be) shorter than the normal operation.

It is advantageous if the device is not in the test operation mode, if it is in the normal operation mode and/or if it is not in the normal operation mode, if it is in the test operation mode.

Terms used in this document should preferably be understood as they would be understood by a person skilled in the art in this field. If several interpretations are possible in the respective context, any interpretation is preferably disclosed individually. In particular in the event of a lack of clarity, as an alternative or in addition the definitions set out in this document can be used.

In the normal operating state (abbreviated to "normal operation") the device preferably performs a function and in the test operating state (abbreviated to "test operation") the ability of the device to perform the said operation is tested. Alternatively or in addition the "test operation" should preferably be understood to be the state of the device that serves predominantly or completely for testing the operation of the device, and the "normal operation" should be understood to be the state that is not the test operation.

The term "connected" can preferably mean that the components designated as "connected" are connected by means of a line. The term "connectable" can preferably mean that the components designated as "connectable" are connected to one another by means of a line provided with a switch, wherein the line can be interrupted by means of the switch.

If it is stated that the sensor has specific components, this can advantageously mean that these components are assembled (in particular arranged in the same housing) and can be handled in this state (for example, can be transported or sold) as a unit. The same applies to the actuator.

For ease of reference, when the second or an emulated receiving circuit signal is mentioned, preferably the second receiving circuit signal and/or a third and/or fourth, etc. (or generally a "n-th", where n>1) receiving circuit signal is disclosed. Accordingly, when a second or an emulated output signal is mentioned, preferably the second output signal and/or a third and/or fourth, etc. (or generally a "n-th", where n>1) output signal is disclosed. If it is stated that an output signal would be generated from a receiving circuit signal and/or as a function thereof, the generation of an output signal is preferably disclosed which bears the same number as the receiving circuit signal (i.e., for example, the fourth output signal from the fourth receiving circuit signal).

When a second control signal is mentioned, preferably the second control signal and/or a third and/or fourth, etc. (or generally a "n-th", where n>1) control signal is disclosed. If it is stated that a receiving circuit signal is generated from a second control signal and/or as a function thereof, the generation of a receiving circuit signal is preferably disclosed which bears the same number as the control signal.

Actions which are disclosed in the form of suitabilities, capabilities, characteristics or functions of the device described in this document (or parts thereof), are also disclosed (independently and in any combination) as method steps and are dependent and independent of the corresponding device or the corresponding device part.

Moreover, the use of features of the described devices or device parts are disclosed (independently and in any combination) as method steps.

On the other hand, the disclosed devices or device parts can have means which can carry out one or more of the method steps referred to in connection with the disclosed method and/or are designed therefor.

Features of variants of an embodiment that are described in the introduction in connection with the prior art are also disclosed as optional features of the invention.

BRIEF DESCRIPTION OF THE DRAWINGS

In the schematic drawings which are not true to scale.

DETAILED DESCRIPTION OF THE INVENTION

The invention is explained below by way of example with reference to the drawings.

Figure 1:
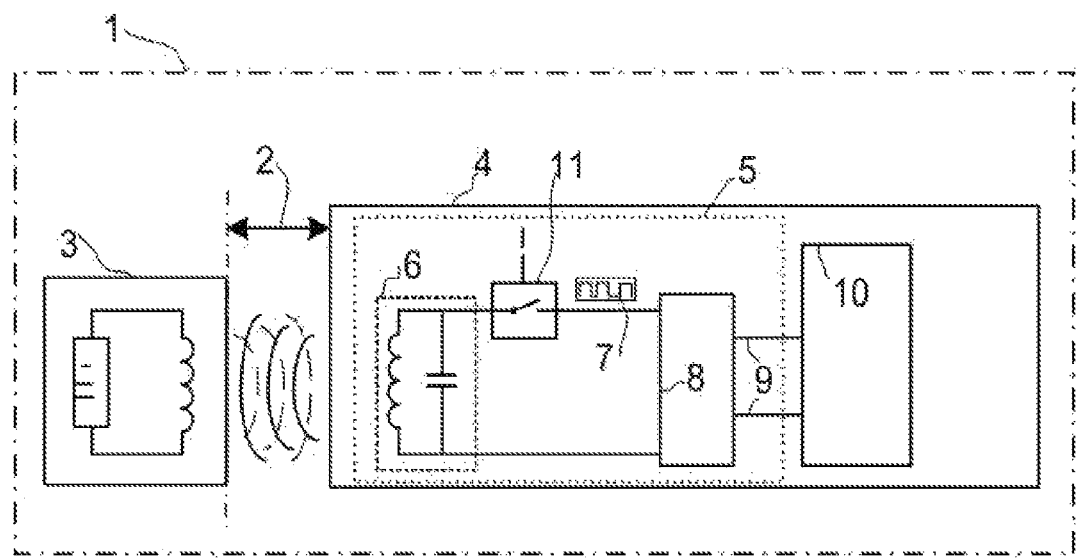
FIG. 1 shows a device for monitoring a closing position of two parts that are movable relative to one according to the prior art.

FIG. 1 shows a device for reliable monitoring of a closing position of two parts 3, 4 that are movable relative to one according to the prior art as is known from EP 1647094 B1. Such devices are for use, in particular, as a door contact switch, for example, in a safety door for securing an automatically operating technical installation.

The device 1 includes an actuator 3 and a sensor 4. The sensor 4 has a receiving circuit 5 which generates a defined receiving circuit signal 7 with the aid of a sensor element 6 when a switching distance 2 between the sensor 4 and the actuator 3 is undershot. Furthermore, the receiving circuit 5 has a detector element 8 which provides an output signal 9 for a subsequent logic unit 10 when the defined receiving circuit signal 7 is present.

In the case of such secure electronic door contact switches (for example, secure proximity switches, secure locking units) periodic checking of the correct sensor operation is necessary in order to be able to achieve the required safety category (for example Cat 4, PLe according to EN 13849-1).

For this purpose, the device 1 has a test element 11, which is a switching element. The test element 11 makes it possible to interrupt the receiving circuit 5 and thus to temporarily suppress the receiving circuit signal 7. By the interruption of the receiving circuit 5 by means of the test element 11, an error is (deliberately) caused in the form of a lack of signal in the receiving circuit 5. This results in emulation of how the system would react if the actuator 3 were located outside the range of the sensor 4. Thus, it is checked whether the detector element 8 supplies not only a static, possibly erroneous output signal 9 to the logic unit 10.

However, with this type of diagnosis the sensor 4 cannot be imitated, so that no conclusion can be reached, in particular by the detector element 8, as to the correct further processing of any correct or incorrect receiving circuit signal 7. Furthermore, the reaction time of the receiving circuit 5 is disadvantageously prolonged by the temporary suppressions of the defined receiving circuit signal 7.

Figure 2:
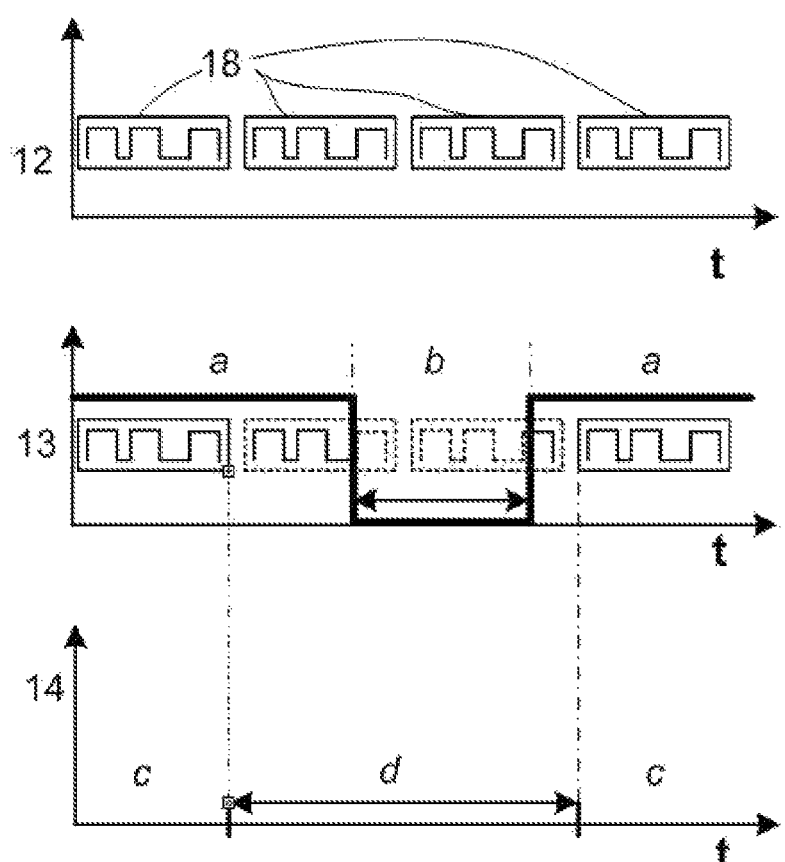
FIG. 2 shows three diagrams to illustrate the mode of operation of the device according to FIG. 1, wherein diagram 12 shows a data flow from data packets in the receiving circuit signal, diagram 13 shows two operating states of the device and the symbolic receiving circuit signal strength, and diagram 14 shows two operating states of the detector element of the device.

The foregoing description is clarified in FIG. 2 (containing diagrams 12, 13 and 14).

Diagram 12 shows the receiving circuit signal 7 as a function of the time, wherein in the depicted time interval the receiving circuit signal 7 is formed by a continuous succession of data packets 18. Such an undisturbed data flow will only occur when the actuator is located within the range of the sensor 4.

Diagram 13 shows the receiving circuit signal 7 as a function of the time, wherein in the depicted time interval the receiving circuit signal 7 is formed by a discontinuous succession of data packets 18. The signal strength of the receiving circuit signal 7 is illustrated symbolically by the bold line. The time interval contains two operating states "a" (normal operation) and "b" (test operation) of the device.

In operating state "a" the test element 11 connects the sensor element 6 to the detector element 8.

In operating state "b" the test element 11 separates the sensor element 6 from the detector element 8, so that the receiving circuit signal 7 is interrupted, i.e., for example, the signal strength of the receiving circuit signal 7 is zero during the interruption. For the detector element 8 one or more data packets 18 are not discernible during the operating state "b" and consequently no valid output signal 9 is provided to the subsequent logic unit 10. The logic unit 10 serves for checking whether during the operating state "b" (correctly) no valid output signal 9 is received.

This separation of the sensor element 6 from the detector element 8 is not synchronized with the reception of the data packets 18 by the detector element 8. Therefore, in the operating state "b" potentially unnecessarily many data packets 18 are lost. These invalid data packets 18 are shown in the diagram 13 by broken lines.

Diagram 14 divides the time interval according to diagram 13 into the time intervals "c" and "d", wherein during the intervals "c" valid (complete) data packets 18 are received by the detector element 9 (i.e. the actuator 3 is recognized; an output signal 9 is generated). During the interval "d" invalid (incomplete) data packets 18 or no data packets 18 are received by the detector element 8 (i.e. the actuator is not recognized here; no output signal is generated).

Figure 3:
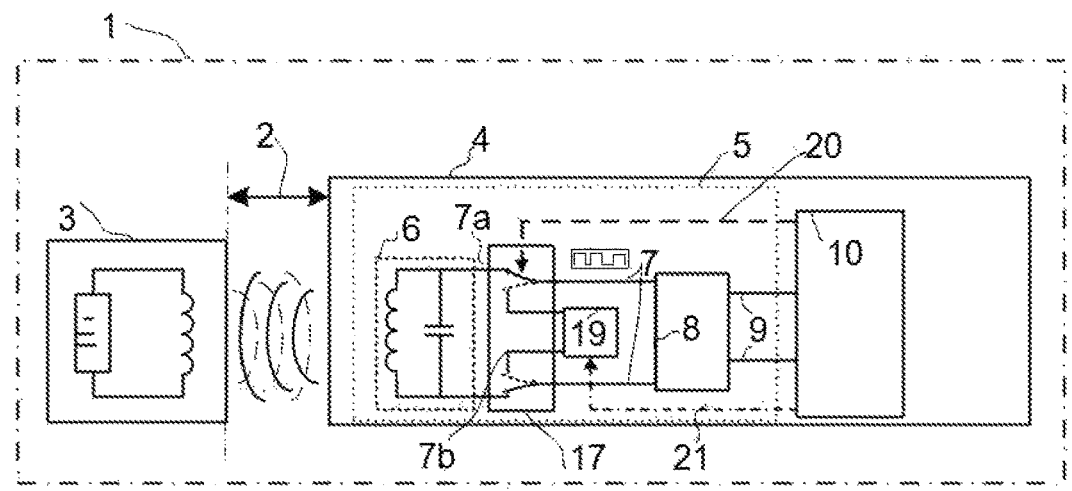
FIG. 3 shows an embodiment of a device for monitoring a closing position of two parts that are movable relative to one according to the invention.

FIGS. 3-7 explain the invention with reference to an exemplary embodiment. To improve comparison with the described prior art, the reference signs shown in FIGS. 1 to 3 are used for the same parts.

FIG. 3 shows a device 1 for secure monitoring of a closing position of two parts that are movable relative to one another, in particular for use as a door contact switch in a safety door for securing an automatically operating technical installation. The device 1 includes an actuator 3 and a sensor 4. Naturally, however, it can also have 2, 3, 4 or more actuators and/or 2, 3, 4 or more sensors. The sensor 4 contains one (or also 2, 3, or more) receiving circuit(s) 5 which generate(s) a defined receiving circuit signal 7a (referred to hereafter as "first receiving circuit signal 7a") with the aid of a sensor element 6 when a switching distance 2 between the sensor 4 and the actuator 3 is undershot. Moreover, the sensor 4 has a detector element 8, which provides a first output signal 9a for a subsequent logic unit 10 when the first receiving circuit signal 7a is present. It can be provided, for example, that the detector element 8 decodes the first receiving circuit signal 7a and as a result generates a decoded information signal, which is the first output signal 9a.

In contrast to the prior art, the receiving circuit 5 in the illustrated exemplary embodiment has a signal emulator 19 and a switch-over element 17. Both the sensor element 6 and also the signal emulator 19 are connected by means of the switch-over element 17 to the detector element 8, wherein the switch-over element 17 can couple the sensor element 6 (or a part thereof) and/or the signal emulator 19 to the detector element 8 and can decouple them from the detector element 8.

The signal emulator 19 serves to generate an emulated receiving circuit signal (referred to below as the "second receiving circuit signal 7b"), wherein the detector element 8 provides a second output signal 9b for the subsequent logic unit 10 when the second receiving circuit signal 7b is present. It can be provided, for example, that the detector element 8 decodes the second receiving circuit signal 7b and as a result generates a decoded information signal, which is the second output signal 9b.

In the present example the logic unit 10 is also used to control switching state of the switch-over element 17 (by means of a control signal 20) and, together with the signal emulator 19, to generate the second receiving circuit signal 7b. It can be provided, for example, that the detector element 8 is a transceiver that generates a carrier wave, wherein the logic unit 10 transmits to the signal emulator 19 a control signal 21 that is modulated onto the carrier wave in the signal emulator 19, so that the second receiving circuit signal 7b is formed. At the same time the signal emulator 19 may have a defined impedance relative to the detector element 8. For the purpose described above the logic unit 10 can comprise one or more microprocessors, ASICs, CPLDs and/or FPGAs, wherein use of a further separate element for generating emulated receiving circuit signals 7b with the signal emulator 19 is not ruled out. Such an element can also have a processor.

In the operating state "e" (normal operation) of the device 1 the test element 17 connects the sensor element 6 to the detector element 8. Thus, when the first receiving circuit signal 7a is present (which is the case when a defined switching distance 2 between the sensor 4 and the actuator 3 is undershot) the detector element 8 provides the first output signal 9a for the logic unit 10.

On the other hand, in the operating state "f" (test operation) the switch-over element 17 connects the detector element 8 to the detector element 19. In the operating state "f" the sensor element 6 or a part thereof (in particular the antenna of the sensor element) is completely decoupled from the detector element 8 by means of the switch-over element 17. The signal emulator 19 receives a control signal 21, wherein the receiving circuit 5 generates a second receiving circuit signal 7b with the aid of the signal emulator 19 and as a function of the control signal 21. The output signal 9b is generated by the detector element 8 as a function of the second receiving circuit signal 7b. Advantageously, different emulated receiving circuit signals and/or different output signals can be generated in the manner described above.

According to a variant different control signals can be generated (as by the logic unit 10, but optionally also by another device component) and transmitted to the signal emulator 19, an emulated receiving circuit signal being generated as a function of the control signal. Both simple and also complex emulated receiving circuit signals may be generated as a function of the control of the logic unit 10 and/or the signal emulator 19. For example, it can be provided that during the test operation (operating state "f") an emulated receiving circuit signal is generated which is formed from a succession of identical or different data packets 18. Due to the different configuration of the data packets 18 it is advantageously possible to produce a dynamic in terms of content or signal strength.

In the test operation (operating state "f") by means of the signal emulator 19 the logic unit 10 can, for example, perform an emulation of the first receiving circuit signal 7a (i.e. the defined receiving circuit signal generated in the normal operation) and thus can simulate the decoupled sensor element 6 by means of emulation. Because the logic unit 10 knows the second receiving circuit signal 7b, it also knows which output signal 9b it should receive from the detector element 8 and thus can test the reception chain, including in particular the detector element 8. Moreover, it is possible to simulate the behavior of the sensor element 6 with discrete components, i.e. to imitate the action of the actuator on the detector element in the sensor by electronic components.

Figure 4:
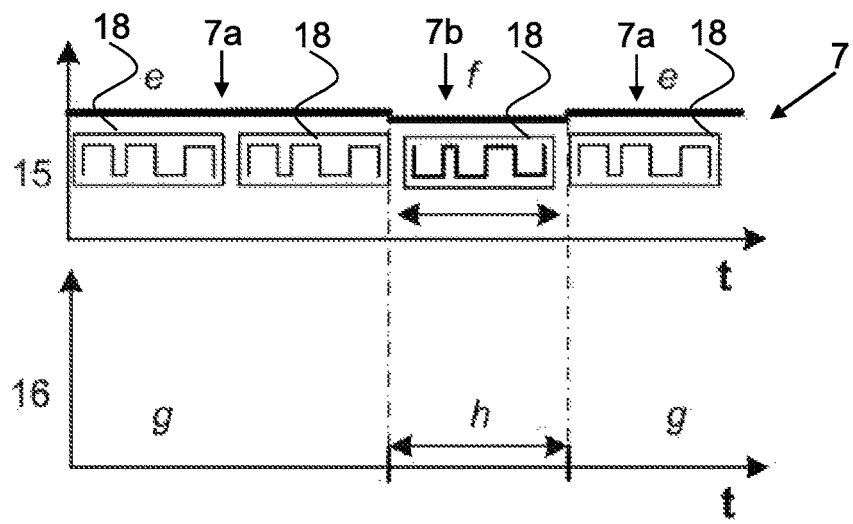
FIG. 4 shows two diagrams to illustrate the mode of operation of the device according to FIG. 3, wherein diagram 15 shows a data flow from data packets in the receiving circuit signal including data packets originating from a signal emulator, and diagram 16 shows two operating states of the detector element of the device.

The foregoing description is clarified in FIG. 4 (containing diagrams 15 and 16).

Diagram 15 shows the receiving circuit signal 7 as a function of the time, wherein in the depicted time interval the receiving circuit signal 7 is formed by a succession of data packets 18. The signal strength of the receiving circuit signal 7 is illustrated symbolically by the bold line. The time interval contains two operating states "e" (normal operation) and "f" (test operation) of the device, wherein the part of the receiving circuit signal 7 that is generated in operating state "e" is designated as the first receiving circuit signal 7a, and the part that is generated in the operating state "f" is designated as the second receiving circuit signal 7b.

During the operating state "e" (normal operation) the switch-over element 17 connects the sensor element 6 to the detector element 8. In the operating state "f" the switch-over element 17 separates the sensor element 6 from the detector element 8 and connects the detector element 8 to the signal emulator 19.

In the operating state "f" the receiving circuit 5 (with the aid of the logic unit 10 and the signal emulator 19) generates the second receiving circuit signal 7b, wherein the data packets from which the second receiving circuit signal 7b is formed do not contain the same information as the data packets which form the first receiving circuit signal 7a that is generated during the operating state "e" by the receiving circuit 5 (when the switching distance 2 is undershot by means of the sensor element 6). However, the data packets of the second receiving circuit signal 7b and of the first receiving circuit signal 7a have the same data format. The signal strength of the second receiving circuit signal 7b can be configured differently by the signal emulator 19 for data packets 18. Furthermore, it is possible to synchronize the start and/or end of the operating state "f" with the succession of data packets 18 of the first receiving circuit signal 7a and/or of the second receiving circuit signal 7b, in order to lose fewer data packets 18. Thus, the test function of the above-mentioned device 1 is performed and nevertheless a fast reaction time (faster evaluation of the receiving circuit signal 7) is guaranteed.

Diagram 16 divides the time interval according to diagram 15 into the time intervals "g" and "h," wherein during the interval "g" valid (complete) data packets 18 of the first receiving circuit signal 7a are received by the detector element 8 (i.e. the actuator 3 is recognized; a first output signal 9 assigned to the first receiving circuit signal 7a is generated). During the time period "h," data packets 18 of the second receiving circuit signal 7b generated with the aid of the signal emulator 19 are received by the detector element 8 (i.e. an emulated actuator (with different code content) is "recognized"; a (different) second output signal 9b assigned to the second receiving circuit signal 7b is generated). Because of the above-mentioned synchronization, the time interval "h" is shorter than the time interval "d" in diagram 14 of FIG. 2, with the mentioned consequences for the reaction time and availability.

The device 1 or parts of the device can also have a multi-channel structure, as explained below with reference to FIGS. 5-7.

Figure 5:
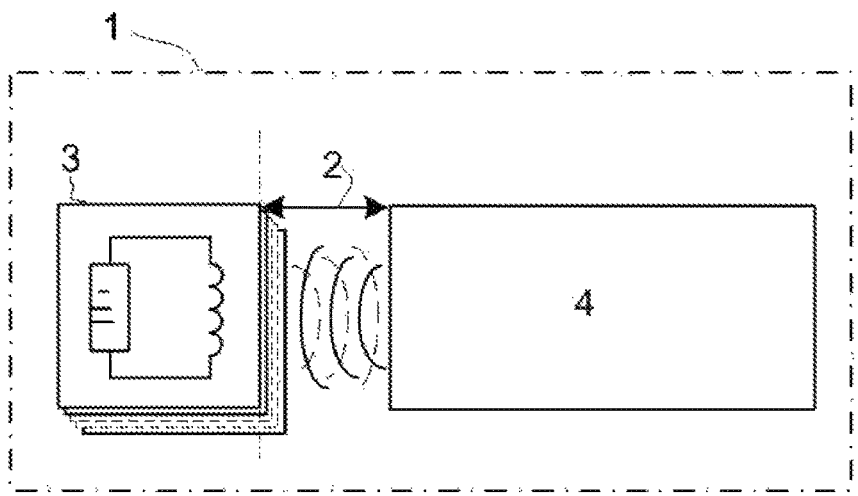
FIG. 5 shows a variant of the device according to FIG. 3 with a plurality of actuators.

FIG. 5 shows a variant of the device 1 with a sensor 4 and a plurality of actuators 3, wherein the sensor 4 recognizes the plurality of actuators 3. Each actuator 3 can have a part such as, for example, a RFID tag that identifies the actuator 3 relative to the sensor 4 and that enables the sensor 4 to distinguish the actuator 3. Alternatively or in addition the device can have one or more actuators.

Figure 6:
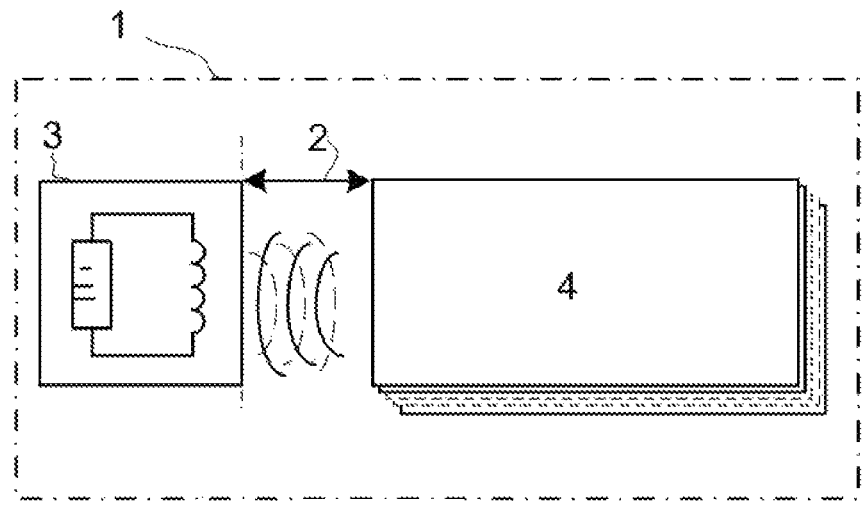
FIG. 6 shows a variant of the device according to FIG. 3 with a plurality of sensors.

FIG. 6 shows a variant of the device 1 with a plurality of sensors 4 and an actuator 3, wherein the sensor 3 recognizes the plurality of sensors 4. Alternatively or in addition the device can have one or more special sensors, in which multiple parts are provided, for example the components designated by the references 5, 6, 7, 8, 9, 10, 17, 18, 19, 20 and/or 21.

Figure 7:
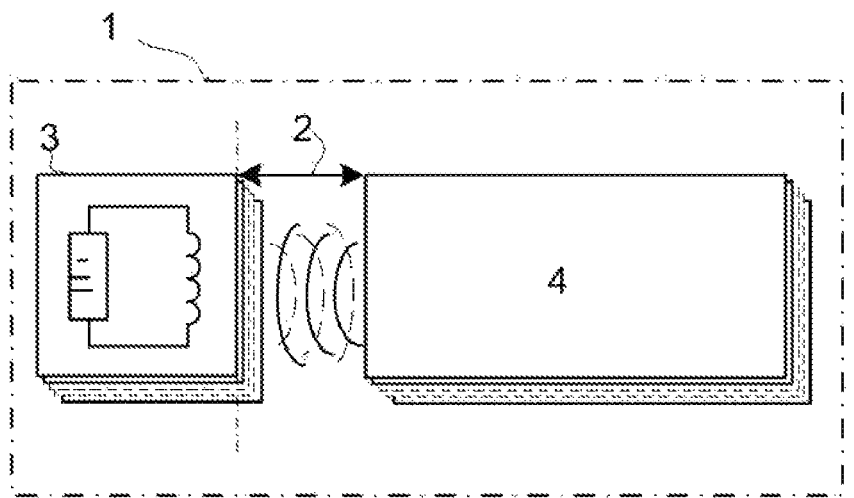
FIG. 7 shows a variant of the device according to FIG. 3 with a plurality of actuators and a plurality of sensors.

FIG. 7 shows a variant of the device 1 with a plurality of sensors 4 and a plurality of actuators 3. This is a combination of the embodiments shown FIGS. 5 and 6. In this variant are a plurality of actuators 3 a recognized by a plurality of sensors 4.

The invention claimed is:

1. A device for use as a door contact switch, comprising:
a sensor and an actuator, wherein the sensor has a receiving circuit with a sensor element and a detector element; and
a computer unit connected to the detector element;
wherein the sensor element is configured to co-operate with the actuator to generate a first receiving circuit signal during a normal operation when a switching distance between the sensor and the actuator is undershot;
wherein the detector element is configured to generate a first output signal as a function of the first receiving circuit signal, and to transmit this output signal to the computer unit;
wherein the receiving circuit has a signal emulator and a switch-over element;
wherein the signal emulator is configured to generate a second receiving circuit signal during a test operation;
wherein the detector element is configured to generate a second output signal as a function of the second receiving circuit signal, and to transmit the second output signal to the computer unit; and
wherein the device is configured or programmed to switch over from the normal operation into the test operation and in each case to switch back into normal operation by the switch-over element in a repeated manner either periodically or aperiodically.

2. The device according to claim 1, wherein the signal emulator is configured to generate one or more additional receiving circuit signals, which differ from the second receiving circuit signal and from one another, in addition to the second receiving circuit signal, during the test operation, and the detector element is configured to generate an output signal in each case as a function of the one or more additional receiving circuit signals and to transmit the output signal to the computer unit.

3. The device according to claim 1 wherein the computer unit is connected to the switch-over element, the computer unit configured to generate a first control signal for control of the switch-over element and to transmit the first control signal to the switch-over element, wherein the switch-over element is configured to perform the switch-over between the normal operation and the test operation as a function of the first control signal, and wherein the computer unit is connected to the signal emulator, the computer unit being configured to generate a second control signal for control of the signal emulator and to transmit the second control signal to the signal emulator, and the signal emulator being configured to generate a second receiving circuit signal as a function of the second control signal.

4. The device according to claim 3, wherein the detector element is configured to generate a carrier wave and the signal emulator is configured to modulate the second control signal onto the carrier wave in order to generate the second receiving circuit signal.

5. The device according to claim 1, wherein information transported by the first receiving circuit signal and by the second receiving circuit signal are in each case structured in a succession of data packets, and wherein the device is configured to perform the switch-over by the switch-over element between the normal operation and the test operation as a function of the succession the data packets, in particular between successive data packets, of the first receiving circuit signal and/or of the second receiving circuit signal.

6. The device according to claim 5, wherein the succession of data packets of the second receiving circuit signal contains a plurality of different data packets.

7. The device according to claim 1, wherein the device monitors a closing position of two parts that are movable relative to one another, the actuator adapted to fasten to one of the two parts and the sensor adapted to fasten to another one of the two parts.

8. A method of testing a device, comprising:
switching a device having a switch-over element from a normal operation to a test operation, the device comprising:
a sensor and an actuator, the sensor having a receiving circuit with a sensor element and a detector element; and
a computer unit connected to the detector element;
wherein the sensor element is configured to co-operate with the actuator to generate a first receiving circuit signal during a normal operation when a switching distance between the sensor and the actuator is undershot, the detector element is configured to generate a first output signal as a function of the first receiving circuit signal, and to transmit this output signal to the computer unit, the receiving circuit has a signal emulator and the switch-over element, the signal emulator is configured to generate a second receiving circuit signal during a test operation, the detector element is configured to generate a second output signal as a function of the second receiving circuit signal, and to transmit the second output signal to the computer unit and the device is configured or programmed to switch over from the normal operation into the test operation and in each case to switch back into normal operation by the switch-over element in a repeated manner either periodically or aperiodically;
generating the second receiving circuit signal with the signal emulator, and
generating the second output signal with the detector element as a function of the second receiving circuit signal, and transmitting the second output signal to the computer unit.

9. The method according to claim 8,
further comprising, generating the first receiving circuit signal by co-operation with the actuator during the normal operation when a switching distance between the sensor and the actuator is undershot,
generating the first output signal by the detector element as a function of the first receiving circuit signal, and transmitting the first output signal to the computer unit,
and comparing the first output signal with the second output signal by the computer unit.

10. The method according to claim 9,
further comprising structuring information transported by the first receiving circuit signal in the form of a succession of data packets, and
wherein the switching of the device from the normal operation to the test operation by the switch-over element takes place between two successive data packets of the first receiving circuit signal.

11. Method according to claim 9,
further comprising structuring information transported by the second receiving circuit signal in the form of a succession of data packets,
wherein switching of the device from the test operation to the normal operation by the switch-over element takes place between two successive data packets of the second receiving circuit signal.

12. The method according to claim 8, further comprising generating plurality of different receiving circuit signals with the signal emulator and, as a function of these receiving circuit signals, generating different output signals by the detector element and transmitting the different output signals to the computer unit, one or more of the different output signals being compared by the computer unit to the first output signal.

13. The method according to claim 8, further comprising simulating a behavior of the sensor element by the signal emulator, wherein the second receiving circuit signal generated by the signal emulator is configured substantially like the first receiving circuit signal generated by the sensor element.

14. The method according to claim 8, wherein during switching from the normal operation to the test operation the sensor element is completely separated from the detector element by the switch-over element.

15. The method according of claim 8, further comprising generating an analog carrier wave in the receiving circuit with the detector element and generating the receiving circuit signals by modulation of the carrier wave, the modulation carried out by digital modulation.

* * * * *